United States Patent [19]
Chen et al.

[11] Patent Number: 5,943,564
[45] Date of Patent: Aug. 24, 1999

[54] BICMOS PROCESS FOR FORMING DOUBLE-POLY MOS AND BIPOLAR TRANSISTORS WITH SUBSTANTIALLY IDENTICAL DEVICE ARCHITECTURES

[75] Inventors: Hung-Sheng Chen; Chih Sieh Teng, both of San Jose, Calif.

[73] Assignee: National Semiconductor Corporation, Santa Clara, Calif.

[21] Appl. No.: 08/600,632

[22] Filed: Feb. 13, 1996

[51] Int. Cl.$^6$ .............................................. H01L 21/8238
[52] U.S. Cl. ......................................... 438/202; 438/234
[58] Field of Search ................................... 438/202, 203, 438/234, 365

[56] References Cited

U.S. PATENT DOCUMENTS

| | | |
|---|---|---|
| 4,957,874 | 9/1990 | Soejima . |
| 5,017,995 | 5/1991 | Soejima .................................. 438/202 |
| 5,028,557 | 7/1991 | Tsai et al. ............................... 438/202 |
| 5,248,624 | 9/1993 | Icel et al. ................................. 437/31 |
| 5,256,582 | 10/1993 | Mosher et al. ............................ 437/31 |
| 5,270,294 | 12/1993 | Fukuma .................................. 438/234 |
| 5,319,234 | 6/1994 | Uga et al. ............................... 257/369 |
| 5,466,615 | 11/1995 | Tsai ........................................ 438/234 |

OTHER PUBLICATIONS

Ikeda, Tatsuhiko et al., "A High Performance CBiCMOS With Novel Self–Aligned Vertical PNP Transistors", *Bipolar/BiCMOS Circuits & Technology Meeting* 15.3, 1994, pp. 238–241.

Haken, Roger, "Process Technology For Submicron BiCMOS VLSI", *IEEE*, 1990.

Havemann, R.H. et al., "Overview of BiCMOS Device and Process Integration", Section 1.2 of 'Processing Technologies', pp. 32–40 of book entitled: *BICMOS Integrated Circuit Design with Analog, Digital, and Smart Power Applications*, author: Elmasry, M., pub.: Piscataway, NJ, IEEE Press (1994).

Feygenson, A. et al., "CBIC–V, A New Very High Speed Complementary Silicon Bipolar IC Process", Paper 7.2, *IEEE*, 1989, pp. 173–177.

Maeda, T. et al., "Lower Submicron FCBiMOS (Fully Complementary BiMOS) Process With RTP and MeV Implanted 5GHz Vertical PNP Transistor", *Symposium on VLSI Technology*, Jun. 4–7, 1990, Honolulu, pp. 79–80.

Watanabe, A. et al., "Future BiCMOS Technology For Scaled Supply Voltage", *International Electron Devices Meeting*, Dec. 3–6, 1989, Washington, D.C., pp. 429–432.

Kobayashi, Yoshiji et al., "High Performance LSI Process Technology: SST CBi–CMOS", *International Electron Devices Meeting*, Dec. 11–14, 1988, San Francisco, CA, pp. 760–763.

Haken, R. et al., "BiCMOS Process Technology", *BiCMOS Technology And Applications*, (1989) Chapter 3, pp. 63–124.

*Primary Examiner*—Tuan H. Nguyen
*Attorney, Agent, or Firm*—Limbach & Limbach L.L.P.

[57] ABSTRACT

A fully complementary double-poly BiCMOS process utilizes substantially identical device architectures to form n-channel and p-channel MOS transistors, as well as npn and pnp bipolar transistors. In the double-poly process, the first layer of polysilicon is utilized to form the source and drain of the MOS transistors as well as the base and collector of the bipolar transistors. The second layer of polysilicon is then utilized to form the gate of the MOS transistors as well as the emitter of the bipolar transistors.

17 Claims, 12 Drawing Sheets

BICMOS PROCESS FOR FORMING DOUBLE-POLY MOS AND BIPOLAR TRANSISTORS WITH SUBSTANTIALLY IDENTICAL DEVICE ARCHITECTURES

BACKGROUND OF THE INVENTION

1. Field of the Invention.

The present invention relates to a complementary BiCMOS process and, more particularly, to a method for forming double-poly MOS and bipolar transistors with substantially identical device architectures.

2. Description of the Related Art.

Performance and manufacturability issues typically surround MOS and bipolar transistors which are formed with conventional BiCMOS processes due to the substantial differences that exist between the architectures of the MOS and bipolar devices.

FIGS. 1A and 1B show cross-sectional diagrams that illustrate the MOS and bipolar transistor architectures that result from using a conventional single-poly BiCMOS process. As shown in FIGS. 1A and 1B, one advantage of the single-poly process is that the gates of the MOS transistors and the emitters of the bipolar transistors are both formed from a single layer of polysilicon.

However, as further shown in FIGS. 1A and 1B, one significant disadvantage of the single-poly process is that when the single layer of polysilicon is etched to form the gates and emitters, the implanted base regions of the bipolar transistors can be significantly overetched. This, in turn, leads to leakage between the emitter and base regions.

The overetching occurs with this process because the implanted base regions are not protected by an etch stop, such as a layer of oxide, whereas the source and drain regions of the MOS transistors are normally protected by a layer of gate oxide during this step.

FIGS. 2A and 2B show cross-sectional diagrams that illustrate the MOS and bipolar transistor architectures that result from using a modified single-poly BiCMOS process. As shown in FIGS. 2A and 2B, the architecture of the MOS transistor remains the same while the architecture of the bipolar transistor incorporates a layer of oxide. The layer of oxide eliminates the overetching problem by forming an etch stop which protects the implanted base region.

The disadvantage of the modified bipolar architecture, however, is that a number of additional process steps are required to use and then remove the layer of oxide not covered by the emitter. In addition, the modified bipolar architecture typically requires a larger layout size.

In addition to using a single-poly architecture, high performance bipolar transistors generally require a double-poly architecture to enhance performance. FIGS. 3A and 3B show cross-sectional diagrams that illustrate the MOS and bipolar transistor architectures that result from using a conventional double-poly BiCMOS process.

As shown in FIGS. 3A and 3B, the architecture of the MOS transistor again remains the same while the architecture of the bipolar transistor incorporates two layers of polysilicon. As further shown, the double-poly process provides the same advantage as the conventional single-poly process, namely that the gates of the MOS transistors and the emitters of the bipolar transistors are both formed from a single layer of polysilicon (poly-2).

Another advantage of the double-poly process is that the layout size of the double-poly bipolar transistor is less than the layout size of the single-poly bipolar transistor. The layout size of the MOS transistor, however, remains the same.

Thus, there is a need for a BiCMOS process which eliminates the above-noted disadvantages, and also provides for a MOS transistor with a reduced layout size.

SUMMARY OF THE INVENTION

The present invention provides a fully complementary BICMOS process which forms the n-channel and p-channel MOS transistors, as well as the npn and pnp bipolar transistors, to have substantially the same architecture.

A fully complementary BiCMOS process in accordance with the present invention begins with the formation of a plurality of field oxide regions on a semiconductor material that has a well region, a collector region, and a plug region formed therein. The field oxide regions are formed so that spaced-apart field oxide regions are formed on the well region, the collector region, and the plug region. Following this, a first layer of polysilicon (poly-1) is deposited over the field oxide regions, the well region, the collector region, and the plug region. Next, a layer of isolation oxide is deposited over the layer of poly-1. After the layers of poly-1 and isolation oxide have been formed, selected portions of the layer of isolation oxide and the underlying layer of poly-1 are etched to form spaced-apart oxide/polysilicon structures over the well region and the collector region, and an oxide/polysilicon structure over the plug region. Following this, a layer of gate oxide is formed over the well region between the spaced-apart oxide/polysilicon structures formed in the well region. Once the gate oxide has been formed, the process continues by forming a second layer of polysilicon over the layer of isolation oxide, the layer of gate oxide, and the collector region between the spaced-apart oxide/polysilicon structures formed in the collector region. After this, selected portions of the second layer of polysilicon are etched to form a first polysilicon structure over a portion of the spaced-apart oxide/polysilicon structures formed in the well region and the layer of gate oxide formed therebetween, and a second polysilicon structure over a portion of the spaced-apart oxide/polysilicon structures formed in the collector region and the surface of the collector region defined therebetween.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 4A–4J show a series of cross-sectional diagrams that illustrate a fully complementary BiCMOS process in accordance with the present invention. As described in greater detail below, the present method forms the n-channel and p-channel MOS transistors, as well as the npn and pnp bipolar transistors, to have substantially the same device architecture. Numerous advantages result from the utilization of a substantially similar device architecture such as a reduced number of processing steps, smaller device sizes for the MOS transistors, improved performance, and a more regular topography.

Figure 1A:
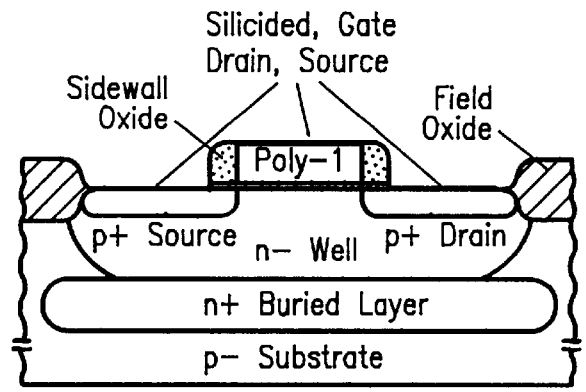
FIGS. 1A and 1B are cross-sectional diagrams illustrating the MOS and bipolar transistor architectures that result from using a conventional single-poly BiCMOS process.
Figure 1B:
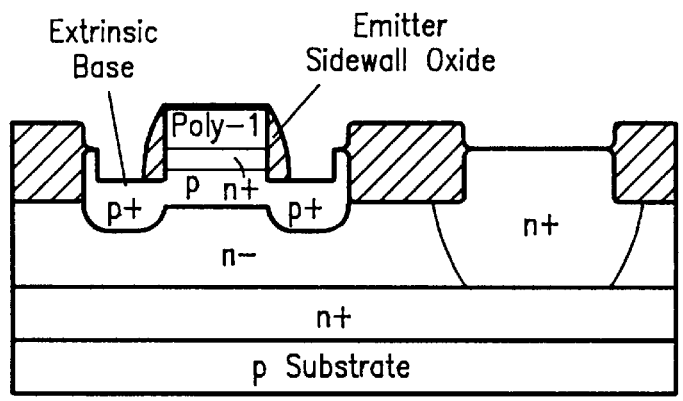
Figure 2A:
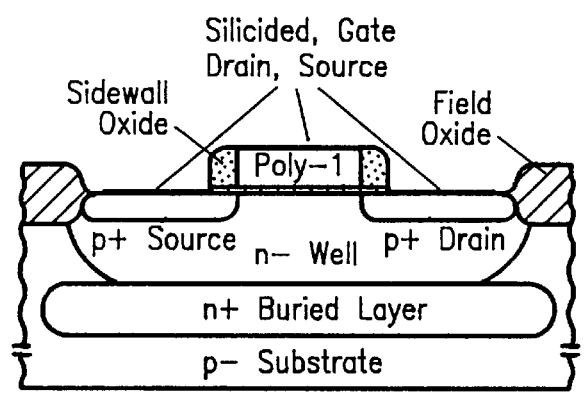
FIGS. 2A and 2B are cross-sectional diagrams illustrating the MOS and bipolar transistor architectures that result from using a modified single-poly BiCMOS process.
Figure 2B:
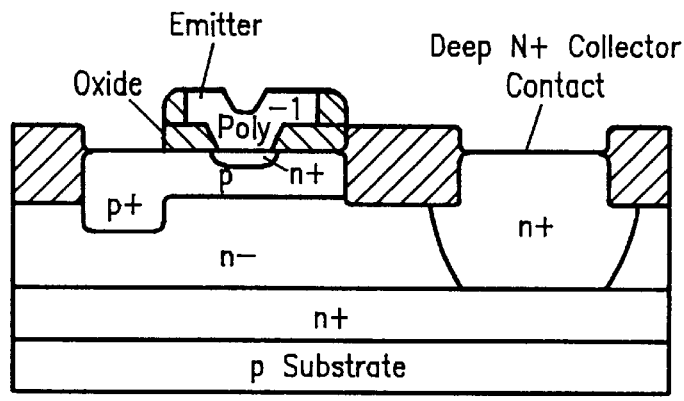
Figure 3A:
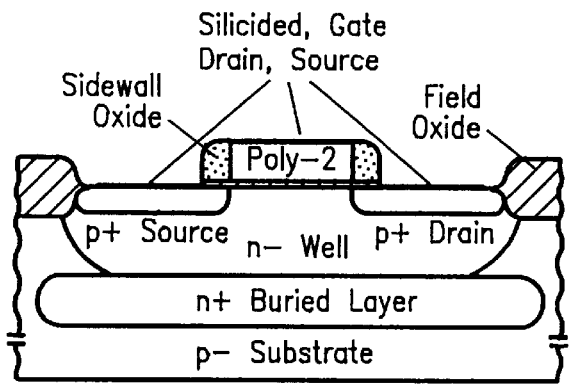
FIGS. 3A and 3B are cross-sectional diagrams illustrating the MOS and bipolar transistor architectures that result from using a conventional double-poly BiCMOS process.
Figure 3B:
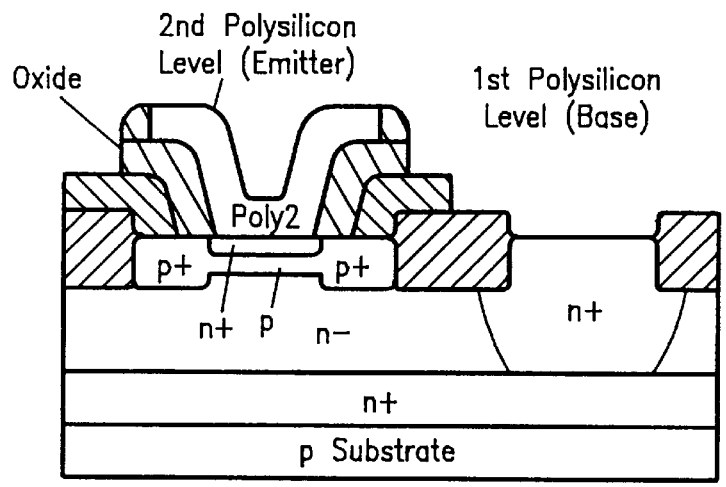
Figure 4A:
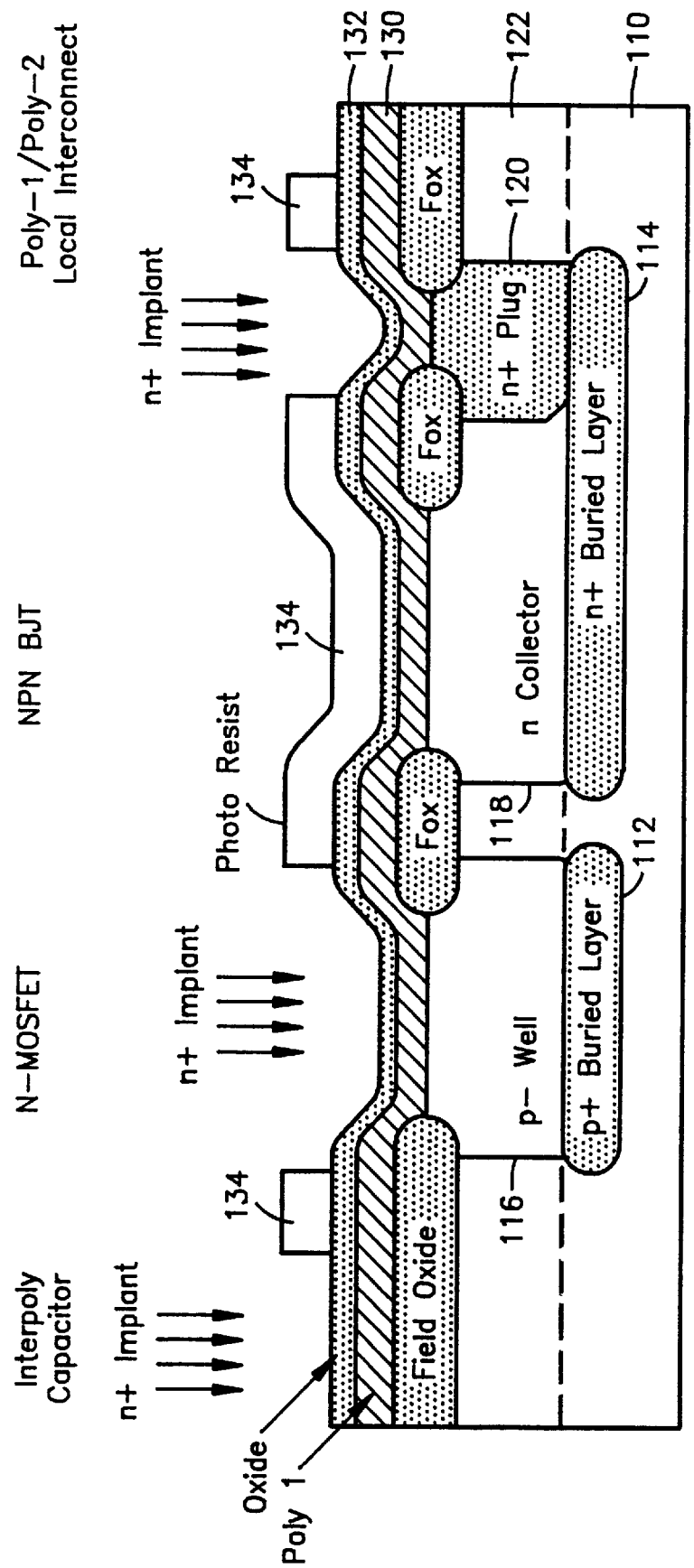
FIGS. 4A–4J are a series of cross-sectional diagrams illustrating a fully complementary BiCMOS process in accordance with the present invention.

Referring now to FIG. 4A, the BiCMOS process of the present invention begins with the conventional formation of a p+ buried layer 112 and an n+ buried layer 114 in a substrate 110. Substrate 110 may be formed to have either an n-type or a p-type conductivity.

Following this, conventional BiCMOS processing steps are utilized to form an epitaxial layer 122 over substrate 110, followed by the formation of a p-well region 116, an n-type collector region 118, and an n+ plug region 120 in epitaxial layer 122. In addition, as shown in FIG. 4A, a plurality of field oxide regions FOX are formed on the top surface of epitaxial layer 122 using standard processing steps so that spaced-apart field oxide regions FOX are formed to define active regions at the surface of the well region 116, the collector region 118, and the plug region 120.

After this, a layer of first polysilicon (poly-1) 130 approximately 2,500 Å thick is deposited over the top surface of well region 116, collector region 118, plug region 120, and the field oxide regions FOX. As described in greater detail below, the layer of poly-1 130 forms the lower plate of a to-be-formed interpoly capacitor, the source and drain regions of a to-be-formed NMOS transistor, the collector and a portion of the base region of a to-be-formed npn bipolar transistor, and the lower level of a to-be-formed interpoly local interconnect line.

Following the deposition of the layer of poly-1 130, a layer of oxide 132 approximately 1000 Å thick is deposited over the layer of poly-1 130. Next, the layer of poly-1 which corresponds to the lower level of the interpoly capacitor, the source and drain regions of the NMOS transistor, the collector of the npn bipolar transistor, and the lower level of the local interconnect line are doped with an n+ type material to have a concentration of approximately $10^{20}$ cm$^{-3}$ using conventional masking and implanting steps as illustrated in FIG. 4A by implant mask 134 and the n+ implant arrows.

Following this, the layer of poly-1 130 which corresponds to the portion of the base region of the bipolar transistor is doped with a p+ material to have a concentration of approximately $10^{20}$ cm$^{-3}$ using conventional masking and implanting steps. (The order of the n+ and p+ masking and implanting steps may be reversed).

Optionally, rather than implanting the n+ and p+ materials through the layer of oxide 132, the n+ and p+ materials can be implanted through a temporary layer of screen oxide. With this option, a layer of screen oxide approximately 150 Å thick is first formed over the layer of poly-1 130. Following this, the n+/p+ masking and implanting steps are performed as described above. Once the n+/p+ materials have been implanted, the layer of screen oxide is removed, followed by the deposition of the layer of oxide 132.

Figure 4B:
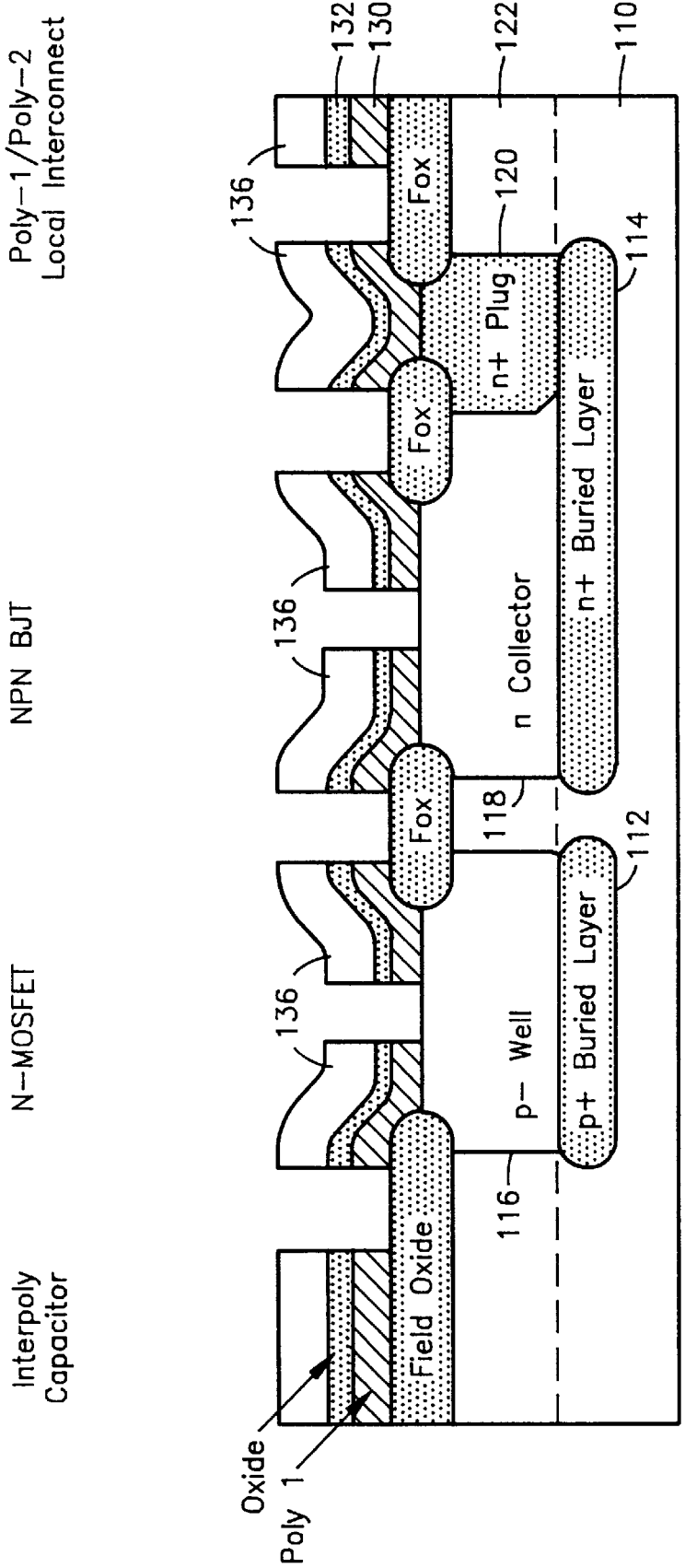

Referring now to FIG. 4B, after the layer of poly-1 130 has been doped, a poly-1 mask 136 is formed and patterned over the layer of oxide 132 to define an oxide/polysilicon structure over the field oxide regions FOX, spaced-apart oxide/polysilicon structures over the well and collector regions 116 and 118, and an oxide/polysilicon structure over the plug region 120. Next, the unmasked areas are etched until the underlying layers of oxide 132 and poly-1 130 have been removed as shown in FIG. 4B. Following this, the poly-1 mask 136 is removed.

Figure 4C:
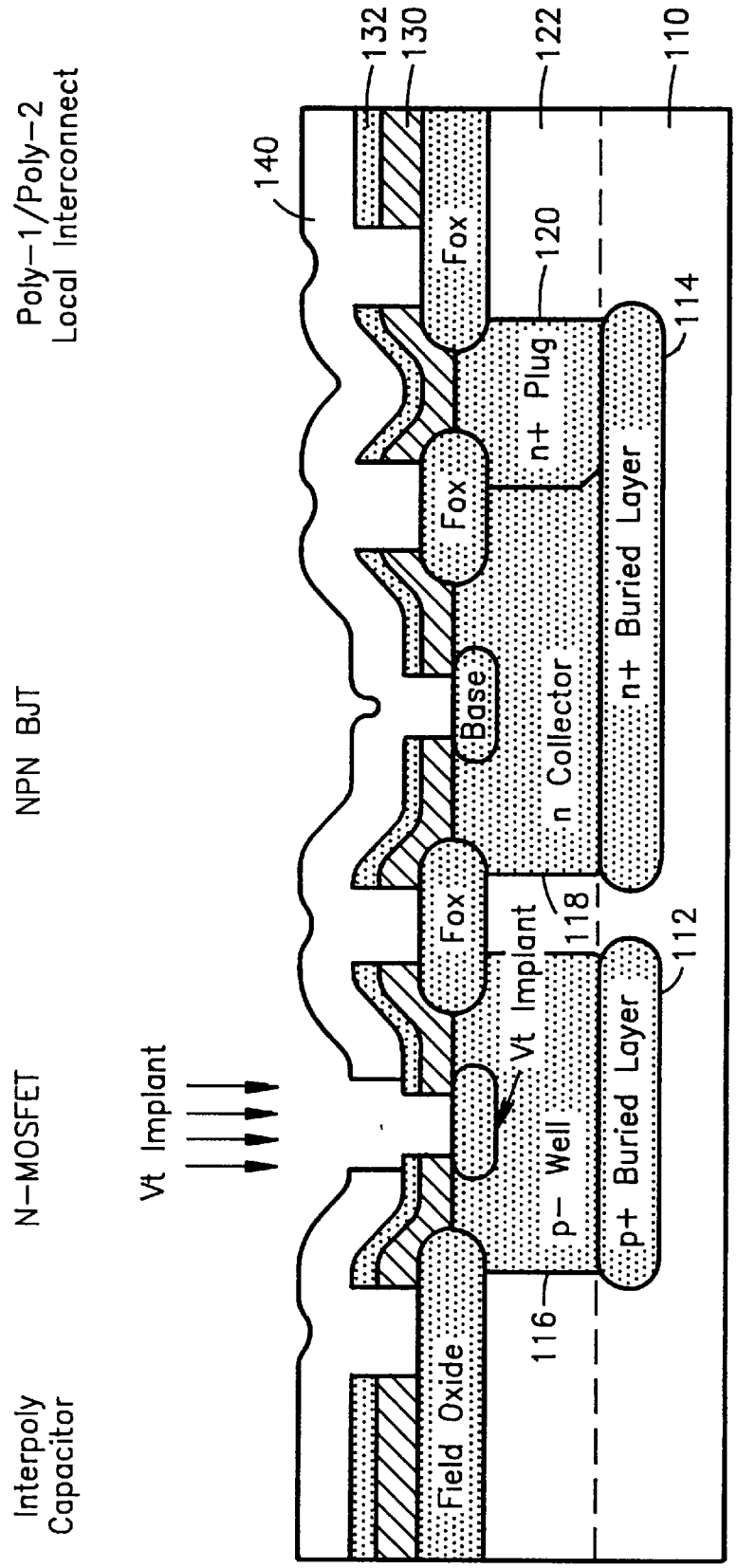

After the oxide/polysilicon structures have been formed, the threshold voltage of the NMOS transistor is then defined by forming and patterning an implant mask 140 as illustrated in FIG. 4C. As shown, the opening in implant mask 140 can be formed to be larger than the opening in the layers of oxide and poly-1. As a result, the oxide/poly opening serves to define the implant region rather than mask 140.

One advantage of the present invention is that by utilizing the oxide/poly opening (instead of mask 140) to define the implant region, a localized $V_t$ implant can be obtained. In conventional processes, the threshold voltage is typically defined by implanting the entire p-well. As a result, a higher concentration of p-type material is formed under the drain region which increases the drain-to-well capacitance which, in turn, reduces the speed of the device.

On the other hand, by utilizing a localized implant, the concentration of p-type material under the drain region is reduced which lowers the drain-to-well capacitance which, in turn, increases the speed of the device.

Following the formation of mask 140, a p-type material is implanted into p-well 116 to form a doping concentration of approximately $10^{17}$ cm$^{-3}$. After this, implant mask 140 is removed.

Following the definition of the threshold voltage, a base implant mask (not shown) is formed and patterned to expose the opening in the n-type collector 118. As above, the opening in the base implant mask can be formed to be larger than the opening in the layers of oxide and poly-1. Thus, the oxide/poly opening serves to define the implant region rather than the base implant mask.

In the present invention, by utilizing a localized implant to form the implanted base region, the base-collector junction capacitance can also be reduced. (The order of the threshold voltage and base region masking and implanting steps may be reversed).

After the base implant mask is formed, a p-type material is implanted into n-type collector 118 to form an implanted base region having a doping concentration of approximately $10^{18}$ cm$^{-3}$. Following this, the base implant mask is removed.

Figure 4D:
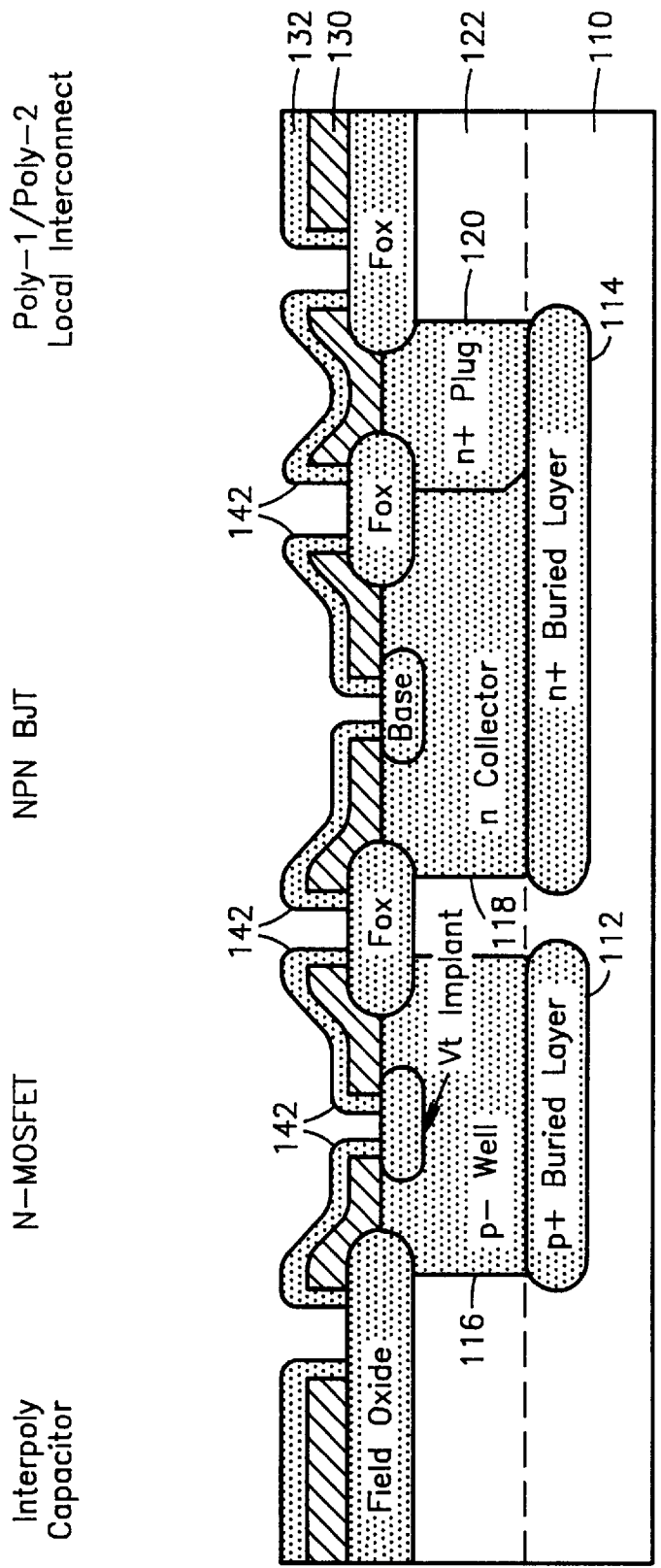

Following the definition of the threshold voltage and the formation of the implanted base region, a layer of oxide (not shown) is deposited, and then anisotropically etched back to form spacers 142 along the sides of the oxide/polysilicon structures as shown in FIG. 4D. By using spacers 142, the channel length of the gate of the to-be-formed NMOS transistor and the size of the emitter of the to-be-formed npn bipolar transistor can be formed to be smaller than they could otherwise be formed which, in turn, allows for the formation of faster devices.

For example, if the opening formed during the etching step which forms the oxide/polysilicon structures as described with respect to FIG. 4B is made as small as is lithographically possible with a given photolithographic process, then the use of spacers 142 allows the size of the opening to be reduced to the size of the actual opening minus two times the spacer width. Thus, by varying the size of the spacers, the gate channel length and the emitter size can be optimized to achieve enhanced performance.

Figure 4E:
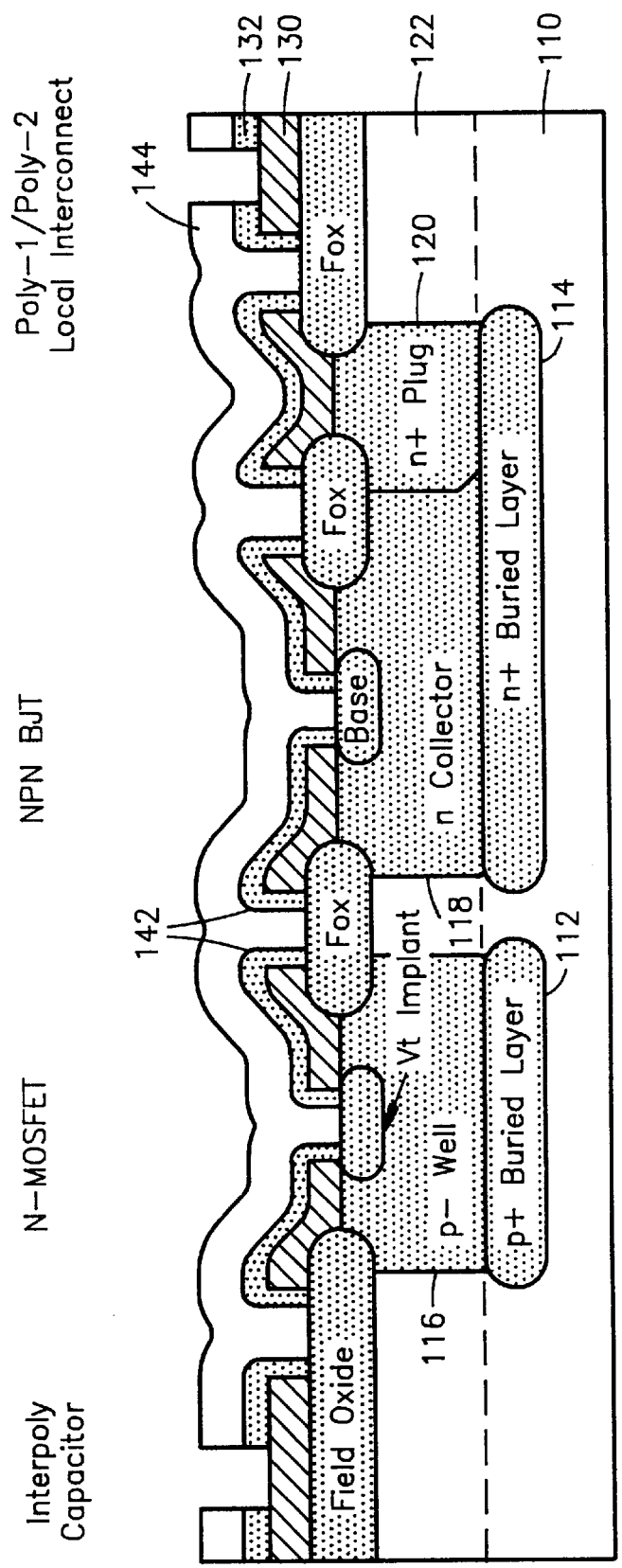

Referring now to FIG. 4E, once spacers 142 have been formed, an oxide mask 144 is formed and patterned over the layer of oxide 132 and the exposed field oxide regions FOX, well region 116, and collector region 118 to define openings over the to-be-formed interpoly capacitor and local interconnect line. Next, the layer of oxide 132 is etched until the unmasked regions have been removed. Following this, oxide mask 144 is removed.

Figure 4F:
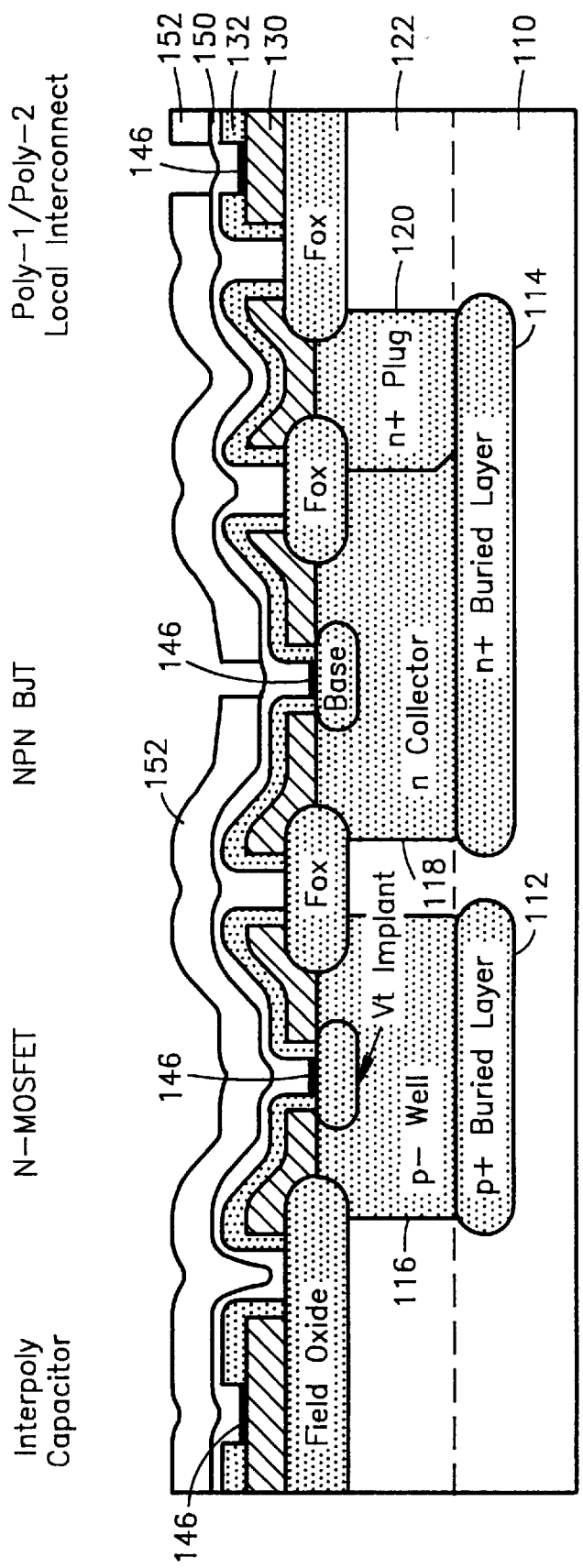

After the openings in the layer of oxide 132 have been formed, a layer of gate oxide 146 approximately 90 Å thick is grown over the exposed portions of poly-1 130, the well region 116 between the spaced-apart oxide/polysilicon structures, and the collector region 118 between the spaced-apart oxide/polysilicon structures as shown in FIG. 4F. (The thickness of the field oxide regions will also be slightly increased as a result of the formation of the layer of gate oxide 146).

Following this, a thin layer of polysilicon (poly-t) 150 approximately 500 Å thick is deposited over just-formed layer of gate oxide 146, the layer of oxide 132, and the field oxide regions FOX to protect the layer of gate oxide 150 associated with the to-be-formed interpoly capacitor and NMOS transistor from photoresist contamination during the next masking step.

Next, a thin poly mask 152 is formed and patterned to expose the layer of poly-t 150 formed over the layer of gate oxide 146 associated with the to-be-formed npn bipolar transistor and local interconnect line.

After the thin poly mask 152 has been formed, the unmasked areas are etched until the layer of poly-t 150 and the underlying layer of gate oxide 146 have been removed from both the to-be-formed npn bipolar transistor and local interconnect line. Following this, the thin poly mask 152 is stripped.

Figure 4G:
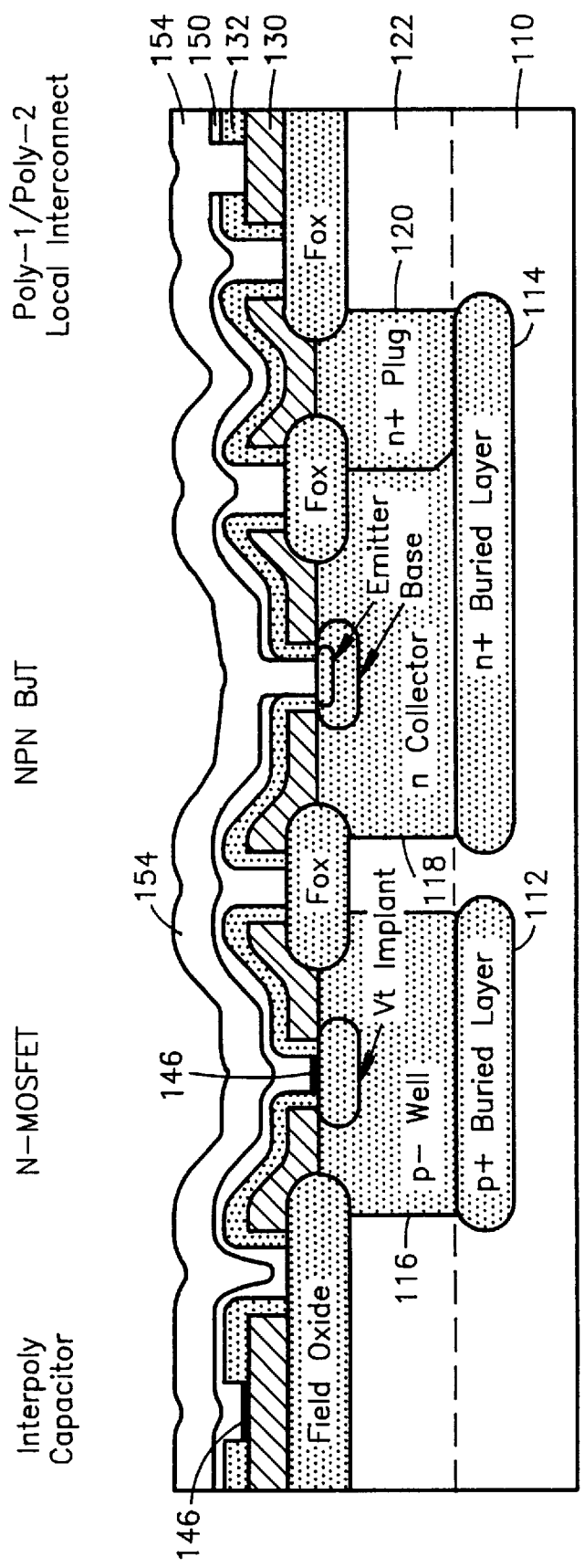
Figure 4H:
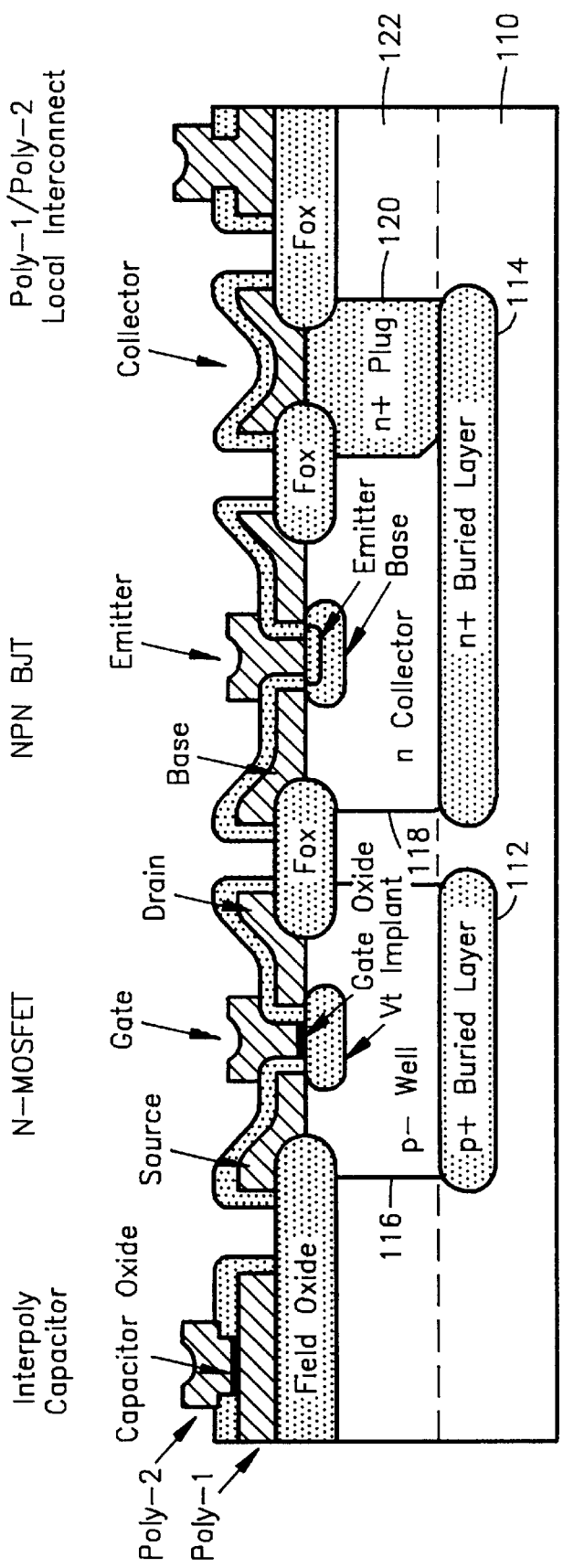

Referring now to FIG. 4G, once the gate oxide and the thin poly mask 152 have been removed, a second layer of polysilicon (poly-2) 154 approximately 2,500 Å thick is deposited over the layer of poly-t 150, the implanted base region of the collector 118 region, and the layer of poly-1 in the local interconnect region.

Next, the layer of poly-2 154 and the underlying layer of poly-t 150 are masked and then doped with an n+ material to have a concentration of approximately $10^{20}$ cm$^{-3}$ where the upper plate of the interpoly capacitor, the gate of the NMOS transistor, the emitter of the npn bipolar transistor, and the upper level of the local interconnect line are to be formed using conventional masking and implanting steps. As shown in FIG. 4G, this implantation step forms a small implanted emitter region within the implanted base region formed in n-type collector 118.

In the present invention, the gate of the NMOS transistor and the emitter of the npn transistor can be implanted during the same masking and implanting step or, alternately, in separate masking and implanting steps. By masking and implanting the gate separately from the emitter, the performance of the emitter and gate can be optimized.

After the layer of poly-2 154 and the underlying layer of poly-t 150 have been doped, the final structure of the devices is defined by forming and patterning a poly-2 mask (not shown) over the layer of poly-2 154. Following this, the unmasked areas are etched to define the upper plate of the interpoly capacitor, the gate of the NMOS transistor, the emitter of the npn bipolar transistor, and the poly-2 local interconnect line. Once the etching has been completed, the poly-2 mask is stripped to form the structure shown in FIG. 4H.

Figure 4I:
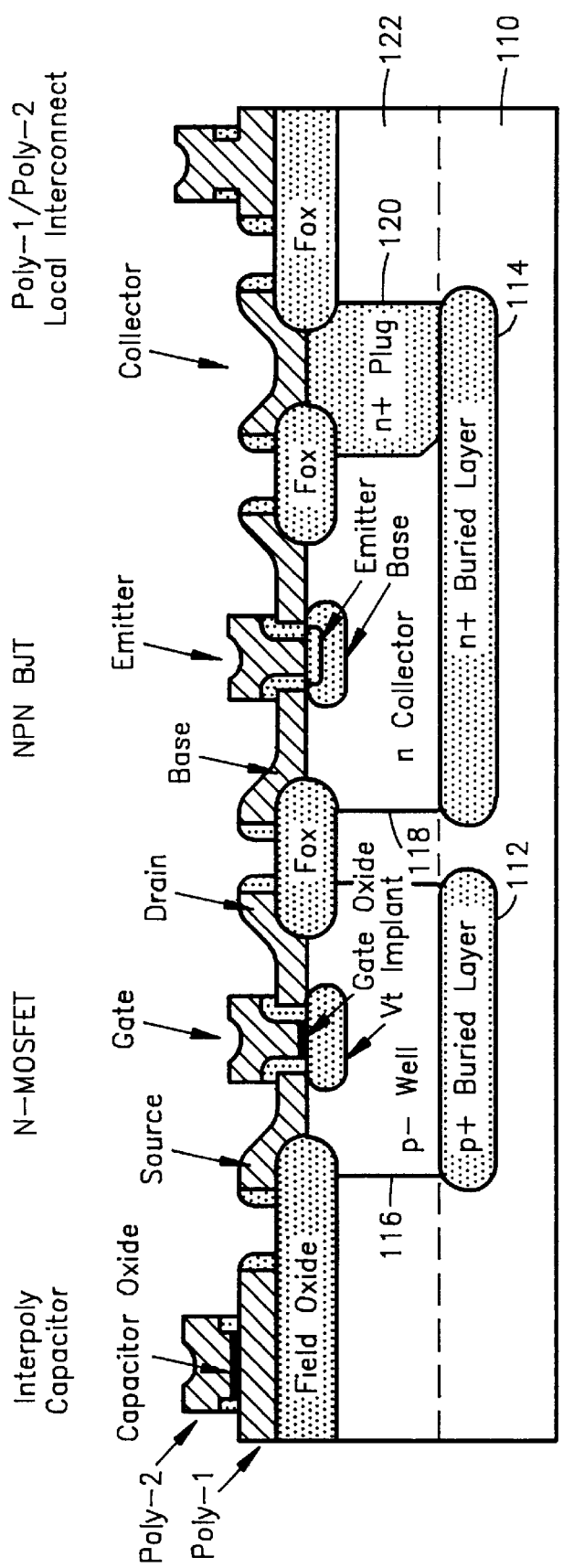

Following the formation of the device structures, the layer of oxide 132 is anisotropically etched as shown in FIG. 4I to expose the top surface of the layer of poly-1 130 for silicide formation.

Figure 4J:
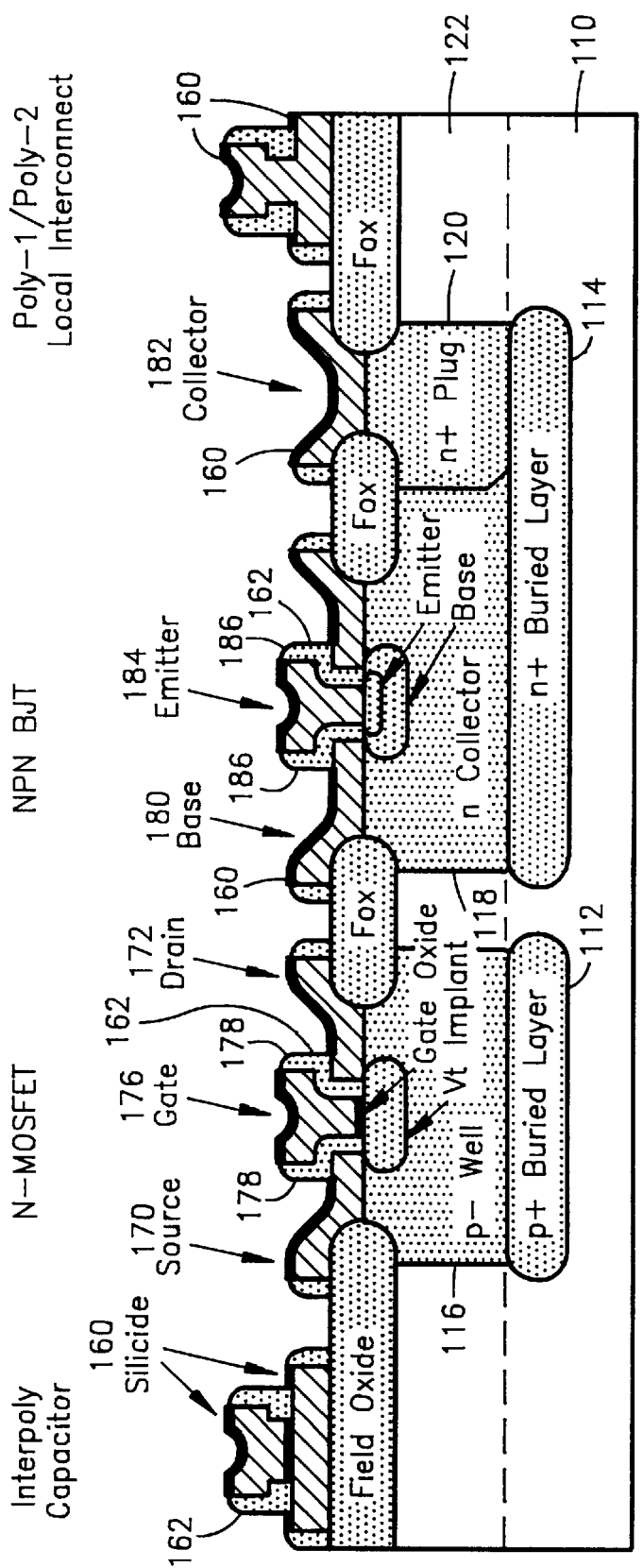

Next, a layer of silicide 160 is formed over the top surface of the layers of poly-1 130 and poly-2 154 using conventional steps. Alternately, as shown in FIG. 4J, a layer of oxide (not shown) can be deposited and etched back to form oxide spacers 162 prior to the formation of the layer of silicide 160 to further isolate the layer of poly-1 130 from the layer of poly-2 154.

After the layer of silicide 160 has been formed, the present method continues with conventional BiCMOS processing steps.

One advantage of the present invention, as illustrated in the preceding processing steps, is that the interpoly capacitor and the interpoly local interconnect lines were formed without any additional processing steps. In addition, the above processing steps result in the interpoly capacitor having a constant capacitance (independent of voltage) because the doping of the layers of poly-1 130 and poly-2 154 is very high.

Another advantage of the present invention is that since the MOS and bipolar transistors utilize a substantially similar device architecture, the source and drain of the MOS transistor, and the base and collector of the bipolar transistor all share the same step height. Similarly, the gate of the MOS transistor and the emitter of the bipolar transistor also share the same step height. As a result, when the contacts are subsequently formed, the contact openings need only be formed to two different depths.

A further advantage of the present invention, as shown in FIG. 4J, is that the size of the MOS transistors can be significantly reduced by forming a portion of the source and drain regions over adjacent field oxide regions. This, in turn, allows a contact to be formed to the portions of the source and drain regions that are formed over the field oxide regions.

With conventional MOS fabrication, a minimum spacing is required between the gate and the adjacent field oxide region to allow for misalignment of the contact. However, since portions of the source and drain regions are formed over the adjacent field oxide regions, these conventional spacing requirements no longer apply.

In summary, a method has been described for forming a BiCMOS transistor device. As shown in FIG. 4J, the MOS and bipolar transistors are formed on a semiconductor material having a well region 116, a collector region 118, and a plug region 120 formed therein.

In addition, a plurality of field oxide regions FOX are formed on the semiconductor material such that spaced-apart field oxide regions FOX are formed on the well region 116, the collector region 118, and the plug region 120. As shown in FIG. 4J, the spaced-apart field oxide regions FOX in the collector and plug regions 118 and 120 can be formed by sharing a field oxide region FOX.

With respect to the MOS transistor, which may be either an n-channel or a p-channel transistor, a polysilicon source and drain 170 and 172 are formed on a top surface of the well region 116. In addition, a layer of gate oxide material 174 is formed on the top surface of the well region 116 between the polysilicon source and drain 170 and 172.

Further, a polysilicon gate 176, which is isolated from the source and drain 170 and 172 by an isolation material 178, is formed over portions of the source and drain 170 and 172, and the layer of gate oxide material 174.

With respect to the bipolar transistor, which may be either an npn or a pnp transistor, a pair of spaced-apart polysilicon bases 180 are formed on the top surface of the collector region 118, while a polysilicon collector 182 is formed on the top surface of the plug region 120.

In addition, a polysilicon emitter 184, which is isolated from the spaced-apart polysilicon bases 180 by an isolation material 186, is formed over portions of the spaced-apart bases 180, and the top surface of the collector region 118 formed therebetween.

It should be understood that various alternatives to the embodiment of the invention described herein may be employed in practicing the invention. For example, although the present invention has only been described in terms of the formation of an n-channel MOS transistor and an npn bipolar transistor, those skilled in the art will readily recognize the applicability of the present invention to the formation of n-channel and p-channel MOS transistors, as well as npn and pnp bipolar transistors.

Thus, it is intended that the following claims define the scope of the invention and that methods and structures within the scope of these claims and their equivalents be covered thereby.

What is claimed is:

1. A method for forming MOS and bipolar transistors on a semiconductor material having a well region and a collector region formed therein, the method comprising the steps of:

forming a plurality of transistor structures over the semiconductor material such that spaced-apart transistor structures are formed over the well region and the collector region, each transistor structure having a layer of first polysilicon and an overlying layer of oxide;

implanting the well region between the spaced-apart transistor structures that are formed over the well region to set a threshold voltage of a MOS transistor;

forming a base region of a bipolar transistor in the collector region between the spaced-apart transistor structures;

forming a layer of gate oxide over the well region between the spaced-apart transistor structures that are formed over the well region after the threshold voltage has been set and the base region has been formed;

forming a second layer of polysilicon over the transistor structures, the layer of gate oxide, and the base region exposed between the spaced-apart transistor structures that are formed over the collector region; and etching selected portions of the second layer of polysilicon to form a first polysilicon structure over the layer of gate oxide, and a second polysilicon structure over the base region.

2. The method of claim 1 wherein the forming a plurality of transistor structures step includes the steps of:

depositing the layer of first polysilicon over the semiconductor material;

forming the overlying layer of oxide over the layer of first polysilicon; and etching selected portions of the overlying layer of oxide and the layer of first polysilicon to form the transistor structures.

3. The method of claim 1 and further comprising the step of implanting the base region to form an emitter region after the second layer of polysilicon has been formed.

4. The method of claim 1 and further comprising the step of forming a plurality of field oxide regions on the semiconductor material such that spaced-apart field oxide regions are formed on the well region and the collector region.

5. The method of claim 1 wherein the step of forming a layer of gate oxide includes the steps of:

forming a layer of gate oxide over the well region and the base region between the spaced-apart transistor structures;

forming an intermediate layer of polysilicon over the layer of gate oxide; and removing the intermediate layer of polysilicon and the layer of gate oxide formed over the base region.

6. The method of claim 1 wherein the base region is formed by implanting the collector region between the spaced-apart transistor structures formed over the collector region prior to forming the layer of gate oxide.

7. The method of claim 1 and further including the step of forming spacers connected to sidewalls of the transistor structures after the threshold voltage has been set and the base region has been formed, and prior to the step of forming the layer of gate oxide.

8. A method for forming MOS and bipolar transistors on a semiconductor material having a well region and a collector region formed therein, the method comprising the steps of:

forming a plurality of transistor structures over the semiconductor material such that spaced-anart transistor structures are formed over the well region and the collector region, each transistor structure having a layer of first polysilicon and an overlying layer of oxide;

forming a layer of gate oxide over the well region between the spaced-apart transistor structures formed over the well region, and over the collector region between the spaced-apart transistor structures formed over the collector region;

forming a layer of second polysilicon over the transistor structures and the layer of gate oxide formed over the well region and the collector region, the layer of second polysilicon being thinner than the layer of first polysilicon;

etching a portion of the layer of second polysilicon and the underlying layer of gate oxide to remove the layer of gate oxide from the collector region;

forming a layer of polysilicon over the layer of second polysilicon, the layer of gate oxide, and the collector region between the spaced-apart transistor structures formed over the collector region; and etching selected portions of the third layer of polysilicon and the underlying layer of second polysilicon to form a first polysilicon structure over a portion of the spaced-apart transistor structures formed over the well region and the layer of gate oxide formed therebetween, and a second polysilicon structure over the spaced-apart transistor structures formed over the collector region and the collector region defined therebetween.

9. The method of claim 8 wherein the forming a plurality of transistor structures step includes the steps of:

depositing the layer of first polysilicon over the semiconductor material;

forming the overlying layer of oxide over the layer of first polysilicon; and etching selected portions of the overlying layer of oxide and the layer of first polysilicon to form the transistor structures.

10. The method of claim 8 and further comprising the step of forming a plurality of field oxide regions on the semiconductor material such that spaced-apart field oxide regions are formed on the well region and the collector region.

11. The method of claim 8 and further including the step of implanting the well region between the spaced-apart transistor structures formed over the well region prior to forming the layer of gate oxide, wherein the implanting step defines a threshold voltage of a MOS transistor.

12. The method of claim 8 and further including the step of implanting the collector region between the spaced-apart transistor structures formed over the collector region prior to forming the layer of gate oxide, wherein the implanting step forms a base region of a bipolar transistor.

13. The method of claim 12 and further comprising the step of implanting the base region to form an emitter region after the second layer of polysilicon has been formed.

14. The method of claim 12 and further including the step of forming spacers connected to sidewalls of the transistor structures after the base region has been formed, and prior to the step of forming the layer of gate oxide.

15. A method for forming MOS and bipolar transistors on a semiconductor material having a well region and a collector region formed therein, the method comprising the steps of:

forming a plurality of field oxide regions on the semiconductor material such that spaced-apart field oxide regions are formed on the well region and the collector region;

depositing a first layer of polysilicon over the field oxide regions, the well region and the collector region;

forming a layer of isolation oxide over the first layer of polysilicon;

etching selected portions of the layer of isolation oxide and the underlying layer of first polysilicon to form spaced-apart oxide/polysilicon structures over the well region and the collector region, and an oxide/polysilicon structure on a field oxide region, each of the oxide/polysilicon structures having sidewalls;

etching selected portions of the layer of isolation oxide on the oxide/polysilicon structure formed on the field oxide region to form an exposed portion of the underlying first layer of polysilicon;

forming a layer of gate oxide over the well region between the spaced-apart oxide/polysilicon structures formed over the well region, and the exposed portion of the underlying first layer of polysilicon;

forming a second layer of polysilicon over the layer of isolation oxide, the layer of gate oxide formed over the well region and the exposed portion of the first layer of polysilicon, and the collector region between the spaced-apart oxide/polysilicon structures formed over the collector region; and etching selected portions of the second layer of polysilicon to form a first polysilicon structure over a portion of the spaced-apart oxide/polysilicon structures formed over the well region and the layer of gate oxide formed therebetween, a second polysilicon structure over the spaced-apart oxide/polysilicon structures formed over the collector region and the collector region defined therebetween, and a third polysilicon structure over the layer of gate oxide and the oxide/polysilicon structure formed over the field oxide region.

16. A method for forming MOS and bipolar transistors on a semiconductor material having a well region and a collector region formed therein, the method comprising the steps of:

forming a plurality of field oxide regions on the semiconductor material such that spaced-apart field oxide regions are formed on the well region and the collector region;

depositing a first layer of polysilicon over the field oxide regions, the well region and the collector region;

forming a layer of isolation oxide over the first layer of polysilicon;

etching selected portions of the layer of isolation oxide and the underlying layer of first polysilicon to form spaced-apart oxide/polysilicon structures over the well region and the collector region, and an oxide/polysilicon interconnect line, each of the oxide/polysilicon structures having sidewalls;

etching selected portions of the layer of isolation oxide on the oxide/polysilicon line to form an exposed portion of the underlying first layer of polysilicon;

forming a layer of gate oxide over the well region between the spaced-apart oxide/polysilicon structures formed over the well region;

forming a second layer of polysilicon over the layer of isolation oxide, the layer of gate oxide formed over the well region and the exposed portion of the first layer of polysilicon, and the collector region between the spaced-apart oxide/polysilicon structures formed over the collector region; and etching selected portions of the second layer of polysilicon to form a first polysilicon structure over a portion of the spaced-apart oxide/polysilicon structures formed over the well region and the layer of gate oxide formed therebetween, a second polysilicon structure over the spaced-apart oxide/polysilicon structures formed over the collector region and the collector region defined therebetween, and a third polysilicon structure over the oxide/polysilicon local interconnect line.

17. A method for forming MOS and bipolar transistors on a semiconductor material having a well region and a collector region formed therein, the method comprising the steps of:

forming a plurality of transistor structures over the semiconductor material such that spaced-apart transistor structures are formed over the well region and the collector region, each transistor structure having a layer of first polysilicon and an overlying layer of oxide;

implanting the collector region between the spaced-apart transistor structures that are formed over the collector region to form a base region;

forming a layer of gate oxide over the well region between the spaced-apart transistor structures formed over the well region after the base region has been formed;

forming a layer of second polysilicon over the transistor structures, the layer of gate oxide, and the collector region between the spaced-apart transistor structures formed over the collector region; and etching selected portions of the second layer of polysilicon to form a first polysilicon structure over a portion of the spaced-apart transistor structures formed over the well region and the layer of gate oxide formed therebetween, and a second polysilicon structure over the spaced-apart transistor structures formed over the collector region and the collector region defined therebetween.

* * * * *

UNITED STATES PATENT AND TRADEMARK OFFICE
CERTIFICATE OF CORRECTION

PATENT NO.: 5,943,564
DATED: August 24, 1999
INVENTOR(S): Hung-Sheng Chen et al.

It is certified that errors appear in the above-identified patent and that said Letters Patent is hereby corrected as shown below:

In Col. 8, line 19, delete "spaced-anart" and replace with --spaced-apart--.

In Col. 8, line 37, after "a" insert --third--.

Signed and Sealed this

Fourth Day of January, 2000

Attest:

Attesting Officer

*Acting Commissioner of Patents and Trademarks*